(12) United States Patent
Roessler et al.

(10) Patent No.: US 8,779,735 B2
(45) Date of Patent: Jul. 15, 2014

(54) SYSTEM AND METHOD FOR AN OVERCURRENT PROTECTION AND INTERFACE CIRCUIT BETWEEN AN ENERGY SOURCE AND A LOAD

(75) Inventors: Werner Roessler, Neufahrn (DE); Gerald Deboy, Klagenfurt (AT)

(73) Assignee: Infineon Technologies AG, Neubiberg (DE)

( * ) Notice: Subject to any disclaimer, the term of this patent is extended or adjusted under 35 U.S.C. 154(b) by 569 days.

(21) Appl. No.: 13/048,398

(22) Filed: Mar. 15, 2011

(65) Prior Publication Data

US 2012/0235661 A1   Sep. 20, 2012

(51) Int. Cl.
G05F 1/573 (2006.01)
G05F 1/595 (2006.01)

(52) U.S. Cl.
USPC ............ 323/271; 323/284; 323/285; 323/908

(58) Field of Classification Search
USPC ............ 323/271, 282, 284, 285, 908; 361/31, 361/87
See application file for complete search history.

(56) References Cited

U.S. PATENT DOCUMENTS

| | | | | |
|---|---|---|---|---|
| 4,575,642 A | * | 3/1986 | Hochreutiner et al. | 327/389 |
| 5,847,912 A | * | 12/1998 | Smith et al. | 361/93.1 |
| 6,661,216 B1 | | 12/2003 | Grant et al. | |
| 6,850,047 B2 | * | 2/2005 | Itabashi et al. | 323/284 |
| 7,345,379 B2 | * | 3/2008 | Okayama et al. | 307/45 |
| 2001/0052759 A1 | * | 12/2001 | Sakurai et al. | 320/134 |
| 2006/0164772 A1 | * | 7/2006 | Guo | 361/93.1 |
| 2008/0136394 A1 | * | 6/2008 | Fukushi et al. | 323/285 |
| 2008/0150483 A1 | * | 6/2008 | Morita et al. | 320/122 |
| 2008/0266738 A1 | * | 10/2008 | Kimber | 361/87 |
| 2009/0148138 A1 | | 6/2009 | Sciuto et al. | |
| 2010/0244800 A1 | * | 9/2010 | Nakamura et al. | 323/284 |
| 2011/0058285 A1 | * | 3/2011 | Wibben | 361/18 |
| 2011/0169470 A1 | * | 7/2011 | Itakura | 323/282 |
| 2011/0317321 A1 | * | 12/2011 | Vogel | 361/87 |
| 2012/0139514 A1 | * | 6/2012 | Paatero | 323/282 |

FOREIGN PATENT DOCUMENTS

| | | | |
|---|---|---|---|
| DE | 199 47 921 A1 | 4/2001 | |
| DE | 103 57 250 A1 | 7/2005 | |
| WO | WO 2010032333 A1 * | 3/2010 | ............ H02M 3/158 |
| WO | WO 2010089338 A2 * | 8/2010 | ............... H02H 3/02 |

* cited by examiner

Primary Examiner — Adolf Berhane
Assistant Examiner — Fred E Finch, III
(74) Attorney, Agent, or Firm — Slater & Matsil, L.L.P.

(57) ABSTRACT

A method for controlling a current between an energy source and a load is disclosed. A switching module is coupled between the energy source and the load. The switching module includes two input terminals coupled to the energy source and two output terminals coupled to the load and at least one semiconductor switching element coupled between one of the input terminals and one of the output terminals. At least one current parameter of the current is measured between the energy source and the load. The current between the energy source and the load is interrupted by switching off the switching element when the at least one current parameter reaches or exceeds at least one predetermined parameter threshold value.

38 Claims, 3 Drawing Sheets

SYSTEM AND METHOD FOR AN OVERCURRENT PROTECTION AND INTERFACE CIRCUIT BETWEEN AN ENERGY SOURCE AND A LOAD

TECHNICAL FIELD

The present invention relates to a method for controlling a current between an energy source and a load, particularly a method for interrupting and switching on a current between an energy source and a load.

BACKGROUND

In numerous applications, like in drive trains with a converter-controlled electric machine, a current between an energy source, like an accumulator or a battery, and a load needs to be controlled by a switch. This type of switch is commonly referred to as a main switch or a main switching module. It is commonly known to implement a main switching module as a relay, which is an electromagnetically operated mechanical switch.

There are some requirements for main switching modules, particularly when applied in power circuits: (a) while in normal operating condition, a main switching module is expected to provide low-loss operation, even at high currents; (b) a main switching module must allow for safe current interruption, i.e., safe overload disconnection or short circuit disconnection; (c) when the load includes a converter, a DC-link capacitance must be charged when switching on the power circuit or the drive train, respectively. The main switching module should be configured to pre-charge the DC-link capacitance prior to normal operation (normal or perpetual operation without malfunction) of the drive train.

Relays, irrespective of whether they are applied in low-power or high-power applications, have several drawbacks. Relays, as being electromechanical switches, include a moving portion having an inherent inertia. This inherent inertia causes a delay between the time when a switching command is applied to the relays and the time when the relays actually switches. When a short-circuit occurs in the load, a significant increase of a short-circuit current may occur during a delay time between an instant when the short-circuit is detected and a switching command is generated and the instant when the relays switches. However, there are applications in which a delayed interruption of the short-circuit current may be hazardous.

Another aspect about short-circuit-save relays (or contactors) is that additional components have to be provided in order to make them electric-arc save, rendering those relays highly expensive, heavy, and considerably bulky.

SUMMARY OF THE INVENTION

The following presents a simplified summary in order to provide a basic understanding of one or more aspects of the present disclosure. This summary is not an extensive overview, and is neither intended to identify key or critical elements of the disclosure, nor to delineate the scope thereof. Rather, the primary purpose of the summary is to present some concepts in a simplified form as a prelude to the more detailed description that is presented later.

A first aspect relates to a method for controlling a current between an energy source and a load. In accordance with one example of the present invention the method includes providing a switching module connected between the energy source and the load. The switching module has at least two input terminals coupled to the energy source and at least two output terminals coupled to the load. At least one electronic switch is coupled between one of the input terminals and one of the output terminals. The current is interrupted between the energy source and the load by switching off the electronic switch, when the at least one current parameter reaches or exceeds at least one predetermined parameter threshold value.

Further, a method is disclosed for switching on a current between an energy source and load. In accordance with one example of the invention the method includes providing a switching module connected between the energy source and the load. The switching module has at least two input terminals coupled to the energy source and at least two output terminals coupled to the load. At least one electronic switch is coupled between one of the input terminals and one of the output terminals. At least one current parameter of the current between the energy source and load and the voltage parameter of the voltage between at least two output terminals is measured. The switching module is operated in a first switching mode, in which the at least one semiconductor switching element is switched on for an on-period and is switched off for an off-period in a pulsed fashion. The switching module in a second switching mode, is subsequently operated so that the at least one semiconductor switching element is switched on such that the duration of its on-period is at least ten times the duration of the on-period during the first switching phase.

The following description and annexed drawings set forth in detail certain illustrative aspects and implementations of the present invention. These are indicative of only a few of the various ways in which the principles may be employed.

BRIEF DESCRIPTION OF THE DRAWINGS

The present invention may be better understood with reference to the following drawings and corresponding description. The components in the Figures are not necessarily to scale, instead emphasis is placed upon illustrating the principles of the invention. Moreover, in the figures, like reference numerals designate corresponding parts.

DETAILED DESCRIPTION OF ILLUSTRATIVE EMBODIMENTS

Embodiments of the present invention will now be explained in a specific context, namely the context of a drive train with an energy source (current source), a switching module, and a load. The drive train can be a stationary drive train in an industrial plant or in a power plant. In this case, the energy source is, for example, a power grid. The drive train could also be a mobile drive train, like a drive train of a mobile vehicle. In this case, the energy source is, for example, an accumulator, like an Lithium-ion accumulator, or a battery. The invention, however, is not restricted to be used in connection with a power train, but could be used in a plurality of different applications in which a current is to be switched between an energy source and a load, in particular in those applications in which a DC current is to be switched. Examples of those applications are switches in telecommunication systems, or specific types of computer servers. Telecommunication switches usually receive a DC supply voltage of 48V provided by a DC voltage source, wherein the voltage source has to be safely disconnected from the switch when a fault in the system occurs. In specific types of computer servers a DC supply voltage of about 400V is provided by a voltage source. This supply voltage is provided to individual units (boards) of the server, with the individual units generating their individual supply voltage of 12V, 5V, 3.3V or 1.2V from the main supply voltage.

Figure 1:
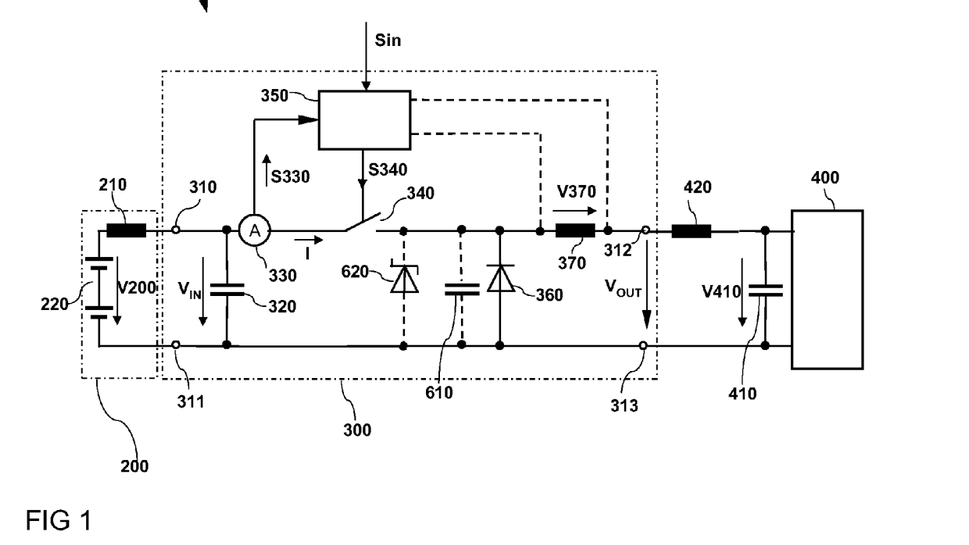
FIG. 1 illustrates a circuit diagram of an electric circuit with an energy source, a load, and a switching module with an electronic switch.

FIG. 1 illustrates a first embodiment of an electric circuit 100 with an energy source 200, a load 400 and a switching module 300 connected between the energy source 200 and the load 400. The energy source 200 may be an energy module with batteries 220, accumulators, super caps, etc. The energy source 200 may include an inherent parasitic inductance which is represented by inductance 210 in FIG. 1. The load 400 may include a converter, an electric machine, wherein the electric machine may include an electric machine for driving an electric vehicle.

The switching module 300 which will also be referred to as main switching module in the following, is usually arranged in close physical vicinity to the energy source 200, resulting in a relatively short wire/line between the energy source 200 and the switching module 300. A load connection line between the switching module 300 and the load 400, however, may have a significant length of several 10 cm up to several meters and, therefore, a significant inductance. A line inductance of a connection line between the switching module 300 and the load 400 is represented by inductance 420 in FIG. 1.

Figure 2:
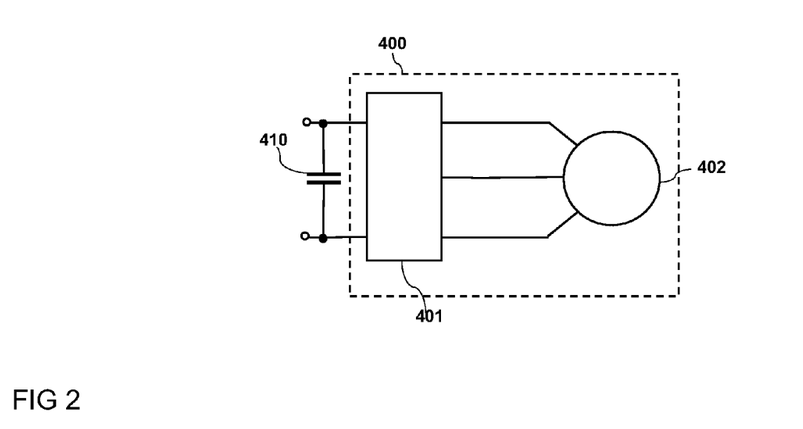
FIG. 2 illustrates a circuit diagram of an embodiment of the load of the electric circuit.

Referring to FIG. 2, which illustrates an embodiment of the load 400, the load may include an electric machine 402 driven by a converter 401, wherein the converter 401 is powered through the energy source 200 via the switching module 300 and the load connection line. A DC-link capacitor 410 can be connected between input terminals of the load 400 (see FIG. 1) and the converter 401 (see FIG. 2), respectively. The DC-link capacitor 410 equalizes voltage swings of the supply voltage provided by the energy source 200 and couples the energy source 200 to the load 400 by providing a common voltage level.

Referring to FIG. 1, the switching module 300 includes input terminals 310, 311 for coupling the switching module 300 to the energy source 200, and output terminals 312, 313 for coupling the switching module to the load. The switching module 300 further includes a switching element 340 connected between one of the input terminals and one of the output terminals. In the embodiment illustrated in FIG. 1, the switching element is connected between the first input terminal 310 and the first output terminal 312. However, the switching element could also be connected between the second input terminal 311 and the second output terminal 313 (not shown). The switching element is an electronic switching element 340 which is switched on and off dependent on a drive signal S340 provided by a control circuit 350. According to one embodiment, the switching element is implemented as a semiconductor switching element, like a MOSFET, an IGBT or a BJT.

The switching module further includes a current measuring device 330 configured to measure at least one parameter of a current I flowing between the energy source 200 and the load 400 through the switching module, and configured to provide a current measurement signal S330 to the control circuit 350. The current measurement signal represents the at least one current parameter measured by the measuring device.

A freewheeling element 360, such as a diode, is connected between the output terminals 312, 313. A polarity of the freewheeling element 360 is selected such that the freewheeling element is capable of conducting a current induced in the line inductance 420 when the switching element 340 of the switching module 300 is switched off.

Optionally, an input capacitance 320 is connected between the input terminals 310, 311. The input capacitance 320 serves to compensate current and/or voltage transients caused by the parasitic inductance 210 of the energy source. Further, an optional inductance 370 is connected in series with the parasitic line inductance.

When the switching element 340 is switched on (is in its on-state) a current I between the energy source 200 and the load 400 may either flow in a first direction from the energy source 200 to the load 400 so that electrical energy is transferred to the load, or in a second direction from the load 400 to the energy source 200 so that electrical energy is transferred back from the load 400 to the energy source 200. A current may flow in the second direction when the load is an electric machine (like a motor) which is operating in a generator mode in which braking energy can be recovered, and in which a backward current flows from the load (the electric machine) towards the energy source 200. This operation is sometimes called recuperation of breaking energy.

Figure 3:
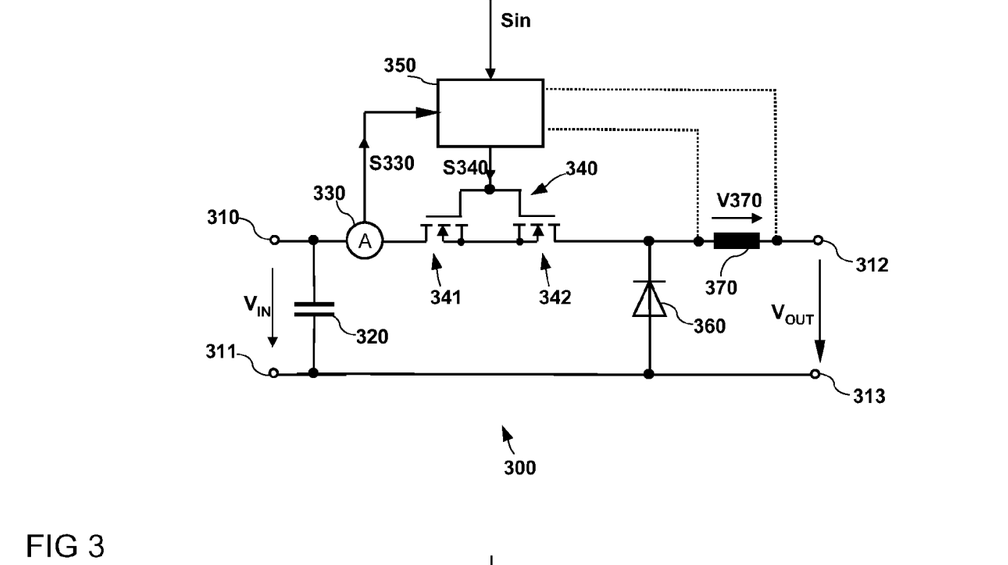
FIG. 3 illustrates a circuit diagram of an embodiment of an electronic switch of the switching module implemented using two transistors.

FIG. 3 illustrates an embodiment of the switching module 300 in which the switching element 340 is implemented with two transistors 341, 342 each having a control terminal and a load path. The load paths of the transistors 341, 342 are connected in series and the two transistors 341, 342 are commonly driven by the drive signal S340. However, it is also possible to drive the first and second transistor 341, 342 by two different drive signals (not shown). In the embodiment illustrated in FIG. 3, the two transistors 341, 342 are implemented as MOSFETs which each have a gate terminal forming a control terminal and a drain-source path (between a drain and a source terminal) forming a load path. In the embodiment of FIG. 3 the two MOSFET are implemented as n-type MOSFET and have their source terminals connected together. However, this is only an example, the two MOSFET could also have their drain terminals connected together and/or could also be implemented as p-type MOSFET.

MOSFETs, specifically power MOSFETs, have an integrated diode, which is also referred to as body diode. Due to this body diode a MOSFET, independent of a drive signal applied to the gate terminal, cannot block voltages of a given polarity. An n-type MOSFET, due to the body diode, always conducts when a positive voltage is applied between the source and the drain terminals, and a p-type MOSFET always conducts when a negative voltage is applied between the source and the drain terminals. In an arrangement with two MOSFET connected in series, with the two MOSFET having same terminals, i.e., either the drain terminals or the source terminals, connected together, the body diodes of the two MOSFET are in an anti-serial configuration so that arrangement always blocks when there is no suitable drive signal applied to the control terminals of the transistors. However, there is no need to use two transistors. In certain applications, one transistor may be sufficient.

Figure 4:
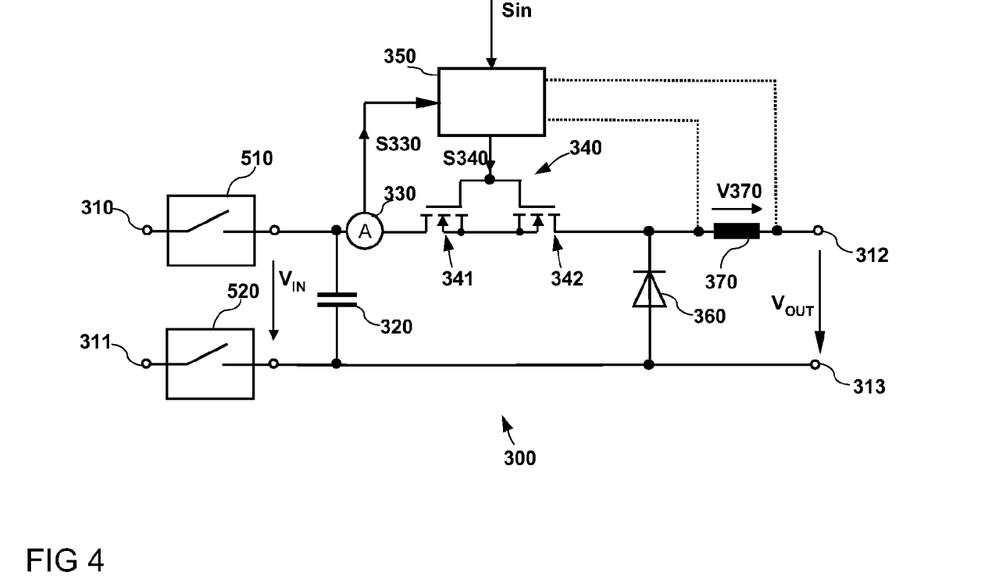
FIG. 4 illustrates a circuit diagram of the main switching module of FIG. 3 additionally including two relays.

FIG. 4 illustrates a further embodiment of the switching module. In this embodiment, the switching module additionally includes two relays 510, 520 coupled to either of the input terminals 310, 311. The relays 510, 520 may be conventional relays for power circuits, i.e., contactors. In the embodiment illustrated in FIG. 4, these relays 510, 520 serve to disconnect the switching module 300 from the energy source 200 after a connection between the energy source 200 and the load 400 has been interrupted by the switching module 300, and serve to connect the switching module 300 to the energy source 200 before the switching module 300 is switched on. Thus, the generation of arcs in the relays is prevented. Using two relays 510, 520 as depicted an all-pole disconnection of load 400 and energy source 200 may be achieved. However, in further embodiments, only one relay or more than two relays included in the main switching module 300 are used. It should be noted that the relays 510, 520 should be capable of conducting a current ranging at around the rated current of the load. However, the relays 510, 520 do not have to be capable of switching a short-circuit current which renders them cheap and light. In the embodiment illustrated in FIG. 4, the relays 510, 520 are connected between the input terminals 310, 311 and the switching module 300. However, this is only an example. In a manner not illustrated in FIG. 4, the relays 510, 520 could also be connected between the switching module 300 and the load 400.

The switching module 300 serves to connect the load 400 to the energy source 200 or to disconnect the load 400 from the energy source 200 by switching on and switching off, respectively, the switching element 340. The switching module connects the load 400 to the energy source 200 dependent on an input signal Sin received by the control circuit. The input signal Sin may assume one of two different signal levels: an on-level when the load 400 is to be connected to the energy source; and an off-level when the load 400 is to be disconnected from the energy source. In a normal operation mode connecting the load 400 to the energy source and disconnecting the load 400 from the energy source 200 is only governed by the input signal Sin. However, the switching module 300 is also configured to disconnect the load 400 from the energy source 200, i.e., to interrupt the current I flowing through the switching module, in the event of a malfunction, such as a short circuit. This prevents the current I from increasing towards critical values that may be hazardous for the load 400 and/or the switching module 300. For this purpose, the current measuring device 330 measures at least one parameter of the current I and provides the current measuring signal S330, which is dependent on the current parameter, to the control unit 350. Such current parameter may be the absolute value |I| of the current and/or the slope dI/dt (differential quotient) of the current I. According to one embodiment, the absolute value of the current I is measured, and there is a linear relationship between the current measurement signal S330 and the absolute value of the current I. The current measuring device 330 can be implemented like a conventional current measurement device so that further explanations are not required in this regard.

It should be noted that the current measuring device 330 can be implemented like a conventional current measuring device which measures the current in order to provide the current measurement signal. In this case, the current parameter to be evaluated is generated from the current measurement signal S330 in the control circuit 350.

Both, the absolute value of the current I and its differential quotient dI/dt can be suitable to detect the occurrence of a short circuit. When a short circuit occurs, the current increases rapidly, so that the current I may absolutely increase above a first threshold value, and the differential quotient dI/dt may increase above a second threshold. Evaluating the current parameter in the control circuit 350 may, therefore, include to compare the absolute value with a first threshold value and/or to compare the differential quotient with a second threshold value. These threshold values can be stored in the control unit 350. The magnitude of these threshold values is dependent on the specific environment in which the switching module 300 is applied. More precisely, the current parameter threshold values may depend on the current ratings of the drive train components.

If the at least one evaluated current parameter reaches or increases above its associated threshold value, the control circuit 350 switches off the switching element 340 independent of the signal level of the input signal Sin.

For explanation purposes it is assumed that the switching module is applied in an electric vehicle and that the current during normal operation ranges at around I=|I|=200 A when the switching module 300 is in its on-state (the switching module is in its on-state when the switching element 340 is switched on). It is further assumed that the absolute value of the current I is evaluated in order to detect a short-circuit and that the threshold value is selected to be 250 A. When, in case of the occurrence of a short circuit, the current reaches this threshold value, the switching element 340 is switched off controlled by the control circuit 350. A delay time between the detection of the short circuit and the time of switching off the switching element, is in the range of several microseconds (μs) like, e.g., 10 μs, when the switching element 340 is implemented with at least one conventional power MOSFET. This delay time is due to signal processing time in the control circuit 350 and due to a switching delay of the switching element 340. The current I may further increase during this delay time. However, by virtue of the short delay time the current I will not significantly increase. If the current slope is, e.g., $50 \cdot 10^6 \, \text{As}^{-1}$, after a short circuit has occurred, the current may increase to 300 A during the delay time.

The delay time and, therefore, the current increase during the delay time is significantly lower than in electromechanical relays. In a conventional relay, a delay time between applying a signal that is intended to switch the relay off and the time of switching is in the range of 1 ms (milliseconds) to several ms which is three orders of magnitude longer than the delay time (response time) of the semiconductor switching element 340. In the example provided herein above, the short current would not increase for more than 50 A during the delay time of the semiconductor switching element 340, but would increase for several thousand ($10^3$) ampere during the delay time of a mechanical relay. Since the maximum current flowing through the switching module 300 is only several percent of the maximum current which would occur in a relay, the power dissipated in the switching module is only several percent of the power that would be dissipated in a relay. Further, the risk of collateral damages can be reduced when the maximum current that can flow through the switching module can be restricted to a low value.

Thus, use of the switching module 300 according to one of the embodiments explained herein before is of considerable advantage compared to state of the art relays. Further it should be noted the occurrence of electric arcs will be prevented in a MOSFET. Without having the risk of the occurrence of electric arcs the size and the weight of the switching module 300 can be significantly reduced compared with a relay module.

The at least one semiconductor switch, such as a MOSFET or an IGBT, used in the switching element 340 may have a low on-resistance and an ohmic (linear) characteristic. in mobility applications, the supply voltage provided by the voltage source 200 is, e.g., in the range of 400V. The on-resistance $R_{DS.on}$ of a conventional MOSFET having a voltage blocking capability of up to 600V and a current rating of 200 A is, e.g., between 2 mΩ and 5 mΩ. The on-resistance $R_{DS.on}$ is the ohmic resistance across of the drain-source path of a transistors when the transistor is in its on-state.

When, like in the embodiments illustrated in FIGS. 3 and 4, the switching element 340 includes two semiconductor switches, such as MOSFETs, connected in series, the semiconductor switching element which is connected such that it is capable of switching a backward current from the load 400 to the energy source 200 may have a lower voltage blocking capability than the other semiconductor switching element. In the circuits of FIGS. 3 and 4 second MOSFET 342 serves to switch the backward current from the load 400 (when the load is operated as a generator) to the energy source, while first MOSFET 341 serves to switch the forward current from the energy source to the load. While the voltage blocking capability of the first MOSFET 341 is, e.g., about 600V, the voltage blocking capability of the second MOSFET 342 is, e.g., only about 100V and has a lower on-resistance of approximately between 0.5 mΩ and 1 mΩ.

When the switching module 300 interrupts the connection between the energy source 200 and the load 400, either because of the input signal Sin assumes an off-level, or because of the detection of a malfunction, and when there is a significant parasitic line inductance 420 (see FIG. 1), a voltage is induced in the line inductance resulting from the inductive energy stored in the line inductance. This voltage causes a freewheeling current to flow through the load (400 in FIG. 1) and/or the optional DC link capacitor (410 in FIG. 1) and through the freewheeling element 360 of the switching module 300 until the energy stored in the line inductance has been dissipated. The freewheeling element 360 protects the switching element 340 from being damaged or destroyed. Without the freewheeling element 360 the inductive energy stored in the line inductance would result in a high voltage across the switching element 340.

The operating principle of the switching module 300 when disconnecting the load 400 from the energy source 200 has been explained in detail herein before. In the following, the operating principle of the switching module 300 at the time of connecting the load to the energy source will be explained.

The switching module 300 is switched on, when the input signal Sin assumes an on-level. However, the switching element 340 is not permanently switched on, when the input signal Sin assumes an on-level, for the following reason. When a DC-link capacitor, like capacitor 410 of FIG. 1, is connected between the input terminals of the load, and when the DC-link capacitor is not charged before the switching module 300 switches on, the capacitor 410 at the time of switching on the switching element 340 acts like a short circuit, thereby causing the current I through the switching module 300 to increase rapidly. In order to prevent the current I to increase to current values which may damage or destroy the switching element, the switching module is configured to pre-charge the DC-link capacitor 410 by switching on and off the switching element 340 in a pulsed fashion before the switching element 340 is permanently switched on. Thus, there are two operation phases after the input signal Sin assumes an on-level, a pre-charge phase, and a permanent-on phase, wherein the switching element is permanently switched on in the permanent on-phase until the input signal Sin assumes an off-level or until an error, like a short circuit, is detected.

Figure 5:
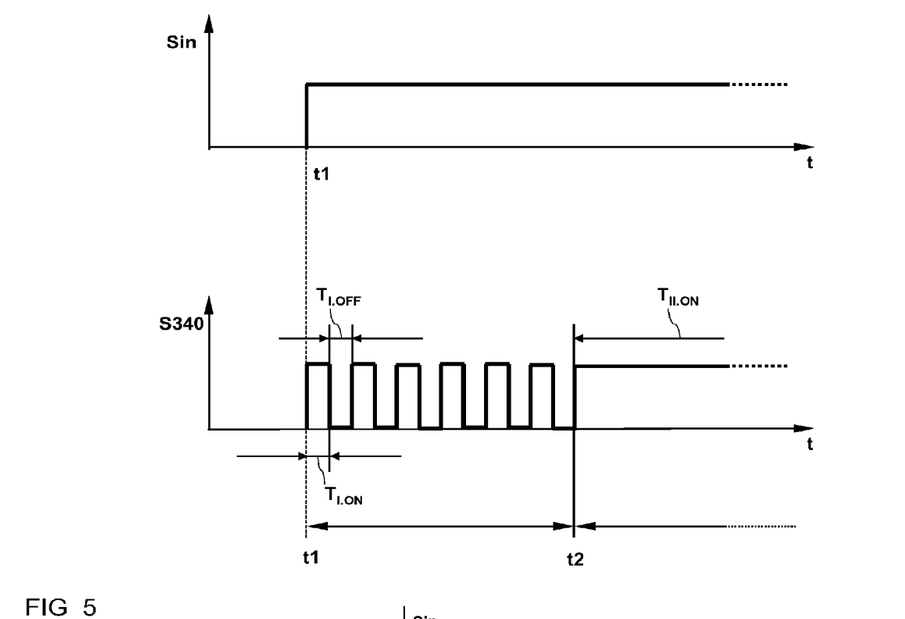
FIG. 5 illustrates the operating principle of the switching module by way of timing diagrams.

FIG. 5 illustrates timing diagrams of the input signal Sin and the drive signal S340 of the switching element in an off-phase of the switching module, which is before the input signal assumes an on-level, and during the pre-charge and permanent-on phase. For explanation purposes it is assumed that a high signal level of the input signal Sin represents an on-level, while a low signal level represents an off-level. Similarly, a high signal level of the drive signal represents an on-level at which the switching element 340 is switched on, while a low signal level represents an off-level at which the switching element 340 is switched off. However, this is only example. In other embodiments, a high level could represent an off-level, and a low level could represent an on-level.

In FIG. 5, t1 denotes the time when the input signal Sin assumes an on-level indicating that the switching module 300 is supposed to be switched on. At this time the pre-charge phase starts. During the pre-charge phase the switching elements 340 is switched on and off in a pulsed fashion. The pre-charge phase includes a plurality of switching cycles, with each switching cycle including an on-period, when the switching element 340 is switched on, and a subsequent off-period, when the switching element 340 is switched off. As long as the DC-link has not been charged to the supply voltage V200 provided by the energy source 200, the current I increases during the on-phase and decreases during the off-phase. The slope of the current increase is dependent on the voltage difference between the supply voltage V200 and the voltage V410 across the capacitor 410. Consequently, the current slope has its maximum at the beginning of the pre-charge phase, when the voltage V410 across the capacitor 410 is zero. Besides the voltage difference V200-V410 between the voltage V200 at the input and the voltage across the DC link capacitor 410 the inductance value of the line inductance influences the current slope during the on-periods, wherein, for a given voltage difference, the slope decreases with increasing inductance value.

According to one embodiment, there is an optional additional inductance connected in series with the line inductance. This additional inductance 370 may help to limit the current slope to a given maximum value. It should be noted that the additional inductance 370 may not necessarily be arranged in the switching module 300, but could also be arranged outside the module.

When the optional inductance 370 is arranged within the module 300, the inductance can also be used to determine the current slope as one of the current parameters evaluated for error detection. In this case, the control circuit 350 receives a voltage V370 across the inductance (this is illustrated in dashed lines in FIG. 1). This voltage V370 is proportional to the differential quotient dI/dt of the current I, with $$V370 = -L370 \cdot dI/dt \qquad (1)$$

where L370 denotes the inductance value of the additional inductance.

In FIG. 5, $T_{I.ON}$ denotes the duration of an on-period in the precharge phase, and $T_{I.OFF}$ denotes the duration of an off-period during the pre-charge phase. There is a plurality of ways to select adjust these time periods:

I. According to one embodiment, the durations $T_{I.ON}$, $T_{I.OFF}$ are fixed time periods which do not change during the pre-charge phase.

II. According to another embodiment, the durations $T_{I.ON}$ of the on-periods increases with time during the pre-charge phase. The durations $T_{I.OFF}$ of the off-periods can be constant or can decrease with time during the pre-charge phase.

II. According to yet another embodiment, the current I is measured during the pre-charge phase, wherein the switching element 340 is switched off each time the current I reaches a first threshold value, and is again switched on after the current has decreased to a second threshold value. This operation principle is similar to that of an hysteretic current controller.

In FIG. 5, t2 denotes the time when the permanent-on phase starts in which the switching element 340 is permanently switched on. In this connection, "permanently" means until the switching signal Sin assumes an off level or until an error is detected. It should be noted that a time duration $T_{II,ON}$ for which the switching element 340 is switched on in the permanent-on phase is significantly longer than the duration of an on-period in the pre-charge phase. For example the on-period of the second switching phase at least 10 times greater than the on-period of the first switching phase, i.e., $$T_{II,ON} \geq 10 \cdot T_{I,ON} \quad (2)$$

$T_{II,ON}$ can be in the range of several seconds, several minutes, several hours, or even several days, while $T_{I,ON}$ is, for example in the range of milliseconds (ms), such as between 50 ms and 500 ms.

During the pre-charge phase I, the DC-link capacitance 410 is charged or pre-charged. During the second switching phase II, where electronic switch 340 is in its permanent on-state for the duration of an on-period $T_{II,ON}$, the load 400 is operated, i.e., the electric drive in an electric vehicle provides torque for the propulsion of the vehicle.

A transition of the switching module 300 from the pre-charge phase to the permanent-on phase may occur dependent on one of a plurality of different parameters:

According to one embodiment, the pre-charge phase has a fixed duration, and the switching module 300 enters the permanent-on phase after this time duration.

According to a second embodiment, the control circuit 350 measures the slope (differential quotient dI/dt) of the current I during the on-periods $T_{I,ON}$ in the pre-charge phase, wherein the switching module 300 enters the permanent-on phase when this slope falls below a given threshold value.

According to a third embodiment, the control circuit 350 measures a voltage difference between an output voltage $V_{OUT}$ at the output terminals 312, 313 and an input voltage $V_{IN}$ at the input terminals, wherein the switching module enters the permanent-on phase when this difference decreases below a given threshold.

According to yet another embodiment, the control circuit 350 measures a slope $dV_{OUT}/dt$ of the output voltage $V_{OUT}$, wherein the switching module 300 enters the permanent-on phase when this slope decreases below a given threshold.

When the switching module 300 is in its permanent-on state and the load 400 changes from a load operation to a generator operation, the current I may flow in a reverse or backward direction from the load 400 to the energy source 200. According to one embodiment, the control circuit 350 detects the current flow direction of the current I, for example, by evaluating the current measurement signal S330, and cyclically switches the switching element 340 on and off in order to limit the absolute value of the generator current. Optionally, referring to FIG. 1, a further capacitor 610 and/or a voltage limiting element 620, such as a Zener diode or a series circuit with a plurality of Zener diodes, is connected in parallel with the freewheeling element 360. This capacitor 610 and/or the voltage limiting element 620 provide a freewheeling path for the generator current during those time periods in which the switching element 340 is switched off.

Figure 6:
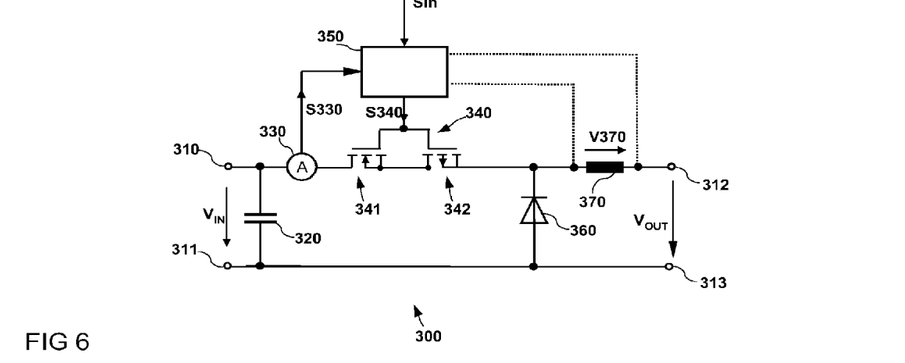
FIG. 6 illustrates a circuit diagram of another embodiment of an electronic switch of the switching module implemented using two transistors.

FIG. 6 illustrates a circuit diagram of another embodiment of an electronic switch of the switching module implemented using two transistors 341 and 342. First and second transistors 341 and 342 have complementary conduction types. As shown, the source terminal of the first transistor 341 is coupled to the drain terminal of the second transistor 342. In another embodiment, the drain terminal of the first transistor 341 is coupled to the source terminal of the second transistor 342.

The method according to the present invention is not limited to the use in electric vehicles. It may serve as a circuit breaker in battery charging systems. Further, the main switching module may be used as a line fuse for photovoltaic systems where high DC currents may occur.

Although various exemplary embodiments of the invention have been disclosed, it will be apparent to those skilled in the art that various changes and modifications can be made which will achieve some of the advantages of the invention without departing from the spirit and scope of the invention. It will be obvious to those reasonably skilled in the art that other components performing the same functions may be suitably substituted. It should be mentioned that features explained with reference to a specific figure may be combined with features of other figures, even in those cases in which this has not explicitly been mentioned. Further, the methods of the invention may be achieved in either all software implementations, using the appropriate processor instructions, or in hybrid implementations that utilize a combination of hardware logic and software logic to achieve the same results. Such modifications to the inventive concept are intended to be covered by the appended claims.

What is claimed is:

1. A method for controlling a current between an energy source and a load, the method comprising:
    providing a switching module coupled between the energy source and the load, the switching module comprising two input terminals coupled to the energy source and two output terminals coupled to the load, and a semiconductor switching element coupled between one of the input terminals and one of the output terminals;
    permanently switching on the semiconductor switching element during normal operation comprising
        operating the switching module in a first switching mode comprising switching the semiconductor switching element on for a first on-period and then switching the semiconductor switching element off for an off-period in a pulsed fashion, and
        operating the switching module in a second switching mode comprising switching the semiconductor switching element on for a second on-period, wherein a duration of the second on-period is at least ten times a duration of the first on-period and the second switching mode directly follows the first switching mode;
    measuring at least one current parameter of the current between the energy source and the load during normal operation; and
    interrupting the current between the energy source and the load by switching off the semiconductor switching element when the at least one current parameter reaches or exceeds at least one predetermined parameter threshold value, wherein the semiconductor switching element is switched off directly from the second switching mode.

2. The method according to claim 1, wherein the switching module further comprises:
    a freewheeling element connected between the two output terminals.

3. The method according to claim 1, wherein the switching module further comprises:
    a current measuring unit configured to measure the at least one current parameter between the energy source and the load.

4. The method according to claim 3, wherein the switching module further comprises:
a control unit configured to control the semiconductor switching element based on the at least one current parameter measured by the current measuring unit.

5. The method according to claim 1, wherein the switching module further comprises:
at least one inductance coupled to at least one output terminal of the switching module.

6. The method according to claim 1, wherein the semiconductor switching element comprises at least one transistor, the at least one transistor having a load path and a control terminal, the load path comprising at least two load terminals, and wherein the load path of the at least one transistor is connected between one input terminal and one output terminal of the switching module.

7. The method according to claim 6, wherein the semiconductor switching element comprises a first transistor and a second transistor, load paths of the first and the second transistor being connected in series, and wherein a control terminal of the first transistor and a control terminal of the second transistor are controlled by the control terminal.

8. The method according to claim 7, wherein the first and the second transistors are MOS-type transistors, the load path of each of the transistors comprising a drain terminal and a source terminal.

9. The method according to claim 8, wherein the first and the second transistor have the same conduction type, and wherein the source terminal of the first transistor is coupled to the source terminal of the second transistor, or wherein the drain terminal of the first transistor is coupled to the drain terminal of the second transistor.

10. The method according to claim 8, wherein the first and the second transistors have complementary conduction types, wherein the source terminal of the first transistor is coupled to the drain terminal of the second transistor, or wherein the drain terminal of the first transistor is coupled to the source terminal of the second transistor.

11. The method according to claim 1, further comprising:
providing at least one relay, the relay being connected between an input terminal and an output terminal of the switching module.

12. The method according to claim 1, wherein the at least one current parameter is an absolute value or a slope of the current through the switching module.

13. A method for switching on a current between an energy source and a load, the method comprising:
providing a switching module coupled between the energy source and the load, the switching module comprising two input terminals coupled to the energy source and two output terminals coupled to the load, and at least one semiconductor switching element coupled between one of the input terminals and one of the output terminals;
operating the switching module in an off mode, wherein the at least one semiconductor switching element is kept switched off in the off mode;
transitioning the switching module from the off mode directly to a first switching mode;
operating the switching module in the first switching mode, wherein the at least one semiconductor switching element is switched on for an on-period and is switched off for an off-period in a pulsed fashion;
transitioning the switching module from the first switching mode directly to a second switching mode;
operating the switching module in the second switching mode, wherein the at least one semiconductor switching element is switched on such that a duration of its on-period is at least ten times a duration of the on-period during the first switching mode; and
transitioning the switching module from the second switching mode directly to the off mode.

14. The method of claim 13, wherein the first switching mode has a fixed time period.

15. The method of claim 13, further comprising:
evaluating at least one electrical parameter and having the switching module enter the second switching mode dependent on the at least one electrical parameter.

16. The method of claim 15, wherein the at least one electrical parameter comprises a slope of a current through the switching module.

17. The method of claim 15, wherein the at least one electrical parameter comprises at least one parameter selected from the group consisting of: a voltage between the two output terminals of the switching module; a slope of the voltage between the two output terminals of the switching module; a voltage difference between a voltage between the two output terminals and a voltage between the two input terminals; and a slope of this voltage difference.

18. The method according to claim 15, wherein the switching module further comprises:
at least one inductance coupled to one of the output terminals.

19. The method according to claim 15, wherein the at least one semiconductor switching element comprises at least one transistor, the at least one transistor having a load path and a control terminal, the load path comprising at least two load terminals, and wherein the load path of the at least one transistor is connected between one input terminal and one output terminal of the switching module.

20. The method according to claim 19, wherein the semiconductor switching element comprises a first and a second transistor, load paths of the first and the second transistor being connected in series, and wherein a control terminal of the first transistor and a control terminal of the second transistor are controlled by the control terminal.

21. The method according to claim 13, wherein the on-period and the off-period are constant during the first switching mode.

22. The method according to claim 13, wherein the switching module further comprises:
a freewheeling element connected between the two output terminals.

23. The method according to claim 13, further comprising:
providing at least one relay, the relay being connected between an input terminal and an output terminal of the switching module.

24. The method of claim 13, further comprising:
in the second switching mode, switching the at least one semiconductor switching element off dependent on a current parameter.

25. The method according to claim 13, wherein the off-period is decreasing during the first switching mode.

26. A switching module comprising:
two input terminals for coupling to an energy source;
two output terminals for coupling to a load; and
a semiconductor switching element coupled between one of the input terminals and one of the output terminals;
wherein the switching module is configured to:
maintain a continuous coupling between the energy source and the load by switching on the switching element during a permanent-on phase, wherein switching on the switching element during the permanent-on phase comprises operating the switching module in a first switching mode comprising switching the semiconductor switching element on for a first on-period and then switching the semiconductor switching element off for an off-period in a pulsed fashion, and operating the switching module in a second switching mode comprising switching the semiconductor switching element on for a second on-period, wherein a duration of the second on-period is at least ten times a duration of the first on-period and the second switching mode directly follows the first switching mode, and during normal operation, measure at least one current parameter of a current between the energy source and the load and to interrupt the current between the energy source and the load by switching off the switching element, when the at least one current parameter reaches or exceeds at least one predetermined parameter threshold value, wherein the semiconductor switching element is switched off directly from the second switching mode.

27. The switching module of claim 26, further comprising a freewheeling element coupled between the two output terminals.

28. The switching module of claim 26, further comprising a current measuring unit configured to measure the at least one current parameter between the energy source and the load.

29. The switching module of claim 28, further comprising a control unit configured to control the semiconductor switching element based on the at least one current parameter measured by the current measuring unit.

30. The switching module of claim 26, further comprising at least one inductance coupled to at least one output terminal of the switching module.

31. The switching module of claim 26, wherein the semiconductor switching element comprises at least one transistor, the at least one transistor having a load path and a control terminal, the load path comprising at least two load terminals, and wherein the load path of the at least one transistor is connected between one input terminal and one output terminal of the switching module.

32. The switching module of claim 31, wherein the semiconductor switching element comprises a first and a second transistor, load paths of the first and the second transistor being connected in series, and wherein a control terminal of the first transistor and a control terminal of the second transistor are controlled by a control unit.

33. The switching module of claim 32, wherein the first and the second transistors are MOS-type transistors, the load path of each of the transistors comprising a drain terminal and a source terminal.

34. The switching module of claim 33, wherein the first and the second transistor have same conduction types, wherein the source terminal of the first transistor is coupled to the source terminal of the second transistor or wherein the drain terminal of the first transistor is coupled to the drain terminal of the second transistor.

35. The switching module of claim 33, wherein the first and the second transistors have complementary conduction types, wherein the source terminal of the first transistor is coupled to the drain terminal of the second transistor or wherein the drain terminal of the first transistor is coupled to the source terminal of the second transistor.

36. The switching module of claim 26, further comprising at least one relay coupled between an input terminal and an output terminal of the switching module.

37. The switching module of claim 26, wherein the at least one current parameter comprises an absolute value or a slope of the current between the energy source and the load.

38. The switching module of claim 26, further comprising the energy source coupled to the two input terminals and the load coupled to the two output terminals.

* * * * *